(12) United States Patent
Kishi et al.

(10) Patent No.: US 10,637,207 B2
(45) Date of Patent: Apr. 28, 2020

(54) DIRECTLY MODULATED LASER DRIVE CIRCUIT

(71) Applicant: NIPPON TELEGRAPH AND TELEPHONE CORPORATION, Tokyo (JP)

(72) Inventors: Toshiki Kishi, Tokyo (JP); Munehiko Nagatani, Tokyo (JP); Shinsuke Nakano, Tokyo (JP); Hiroaki Katsurai, Tokyo (JP); Masafumi Nogawa, Tokyo (JP); Hideyuki Nosaka, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 16/343,349

(22) PCT Filed: Oct. 16, 2017

(86) PCT No.: PCT/JP2017/037345
§ 371 (c)(1),
(2) Date: Apr. 18, 2019

(87) PCT Pub. No.: WO2018/074410
PCT Pub. Date: Apr. 26, 2018

(65) Prior Publication Data
US 2019/0245624 A1 Aug. 8, 2019

(30) Foreign Application Priority Data
Oct. 20, 2016 (JP) ................................ 2016-205702

(51) Int. Cl.
*H01S 3/00* (2006.01)
*H01S 5/042* (2006.01)
(Continued)

(52) U.S. Cl.
CPC ............ *H01S 5/0427* (2013.01); *H01S 5/042* (2013.01); *H01S 5/0687* (2013.01); *H01S 5/06216* (2013.01); *H01S 5/06226* (2013.01)

(58) Field of Classification Search
CPC ...... H01S 5/042; H01S 5/0427; H01S 5/0687; H01S 5/06216; H01S 5/06226
See application file for complete search history.

(56) References Cited

U.S. PATENT DOCUMENTS 5,546,218 A * 8/1996 Komatsubara ........ G02F 1/0121
359/237
6,044,097 A * 3/2000 Kawamura ........... H01S 5/0265
372/38.01
(Continued)

FOREIGN PATENT DOCUMENTS

JP 2009-111168 A 5/2009
JP 2010-205747 A 9/2010
(Continued)

OTHER PUBLICATIONS

International Preliminary Report on Patentability received for PCT Patent Application No. PCT/JP2017/037345, dated May 2, 2019, 10 pages (6 pages of English Translation and 4 pages of Original Document).
(Continued)

*Primary Examiner* — Kinam Park
(74) *Attorney, Agent, or Firm* — Womble Bond Dickinson (US) LLP

(57) ABSTRACT

A driver circuit 11 includes a plurality of cascode-connected NMOS transistors, a modulating signal $V_{GN1}$ is applied to a gate terminal of a lowermost stage transistor $T_{N1}$ located at a lowermost stage out of the NMOS transistors, and an upper stage bias potential $V_{GN2}$ that is a sum of a minimum gate-source voltage $V_{GN1min}$ and a maximum drain-source voltage $V_{DS1max}$ of a transistor ($T_{N1}$) located immediately
(Continued)

below an upper stage transistor located at an upper stage above the lowermost stage transistor of the NMOS transistors is applied to the upper stage transistor $T_{N2}$.

8 Claims, 18 Drawing Sheets

(51) Int. Cl.
 *H01S 5/0687* (2006.01)
 *H01S 5/062* (2006.01)

(56) References Cited

U.S. PATENT DOCUMENTS

| | | | | |
|---|---|---|---|---|
| 6,958,840 B2* | 10/2005 | Tsai | ............ | G02F 1/0121 359/237 |
| 2013/0322886 A1* | 12/2013 | Uemura | ............ | H04B 10/50 398/135 |
| 2014/0126595 A1* | 5/2014 | Nedovic | ............ | H01S 5/0427 372/38.02 |
| 2016/0129513 A1* | 5/2016 | Oka | ............ | B23K 1/0016 372/38.07 |

FOREIGN PATENT DOCUMENTS

| | | |
|---|---|---|
| JP | 2013-239641 A | 11/2013 |
| JP | 2013-251375 A | 12/2013 |
| TW | I230915 B | 4/2005 |

OTHER PUBLICATIONS

International Search Report and Written Opinion received for PCT Patent Application No. PCT/JP2017/037345, dated Nov. 28, 2017, 12 pages (6 pages of English Translation and 6 pages of Original Document).

Moto et al., "A low power quad 25.78-Gbit/s 2.5 v laser diode driver using shunt-driving in 0.18 μm SiGe-BiCMOS", Compound Semiconductor Integrated Circuit Symposium (CSICS), IEEE, 2013, 4 pages.

* cited by examiner

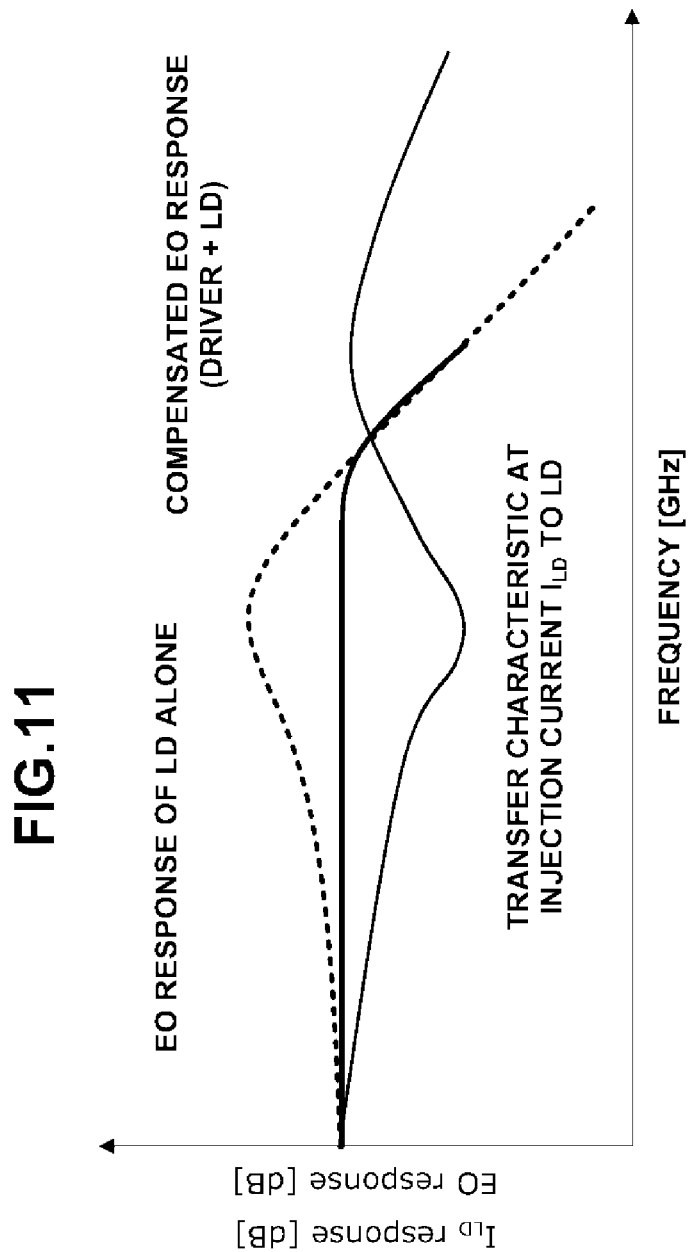

DIRECTLY MODULATED LASER DRIVE CIRCUIT

TECHNICAL FIELD

The present invention relates to a shunt LD driving technique used to drive a DML (Directly Modulated Laser) in which the light intensity of an LD (Laser Diode) is directly modulated.

BACKGROUND ART

In recent years, along with an increase in communication traffic, an optical communication network using an optical fiber is required to have a higher capacity. In particular, Ethernet® serving as a main standard element of the communication network is becoming higher in capacity. Along with such an increase in capacity, the Ethernet standardization has been completed for 10 GbE and 40 GbE. The standardization process for 100 GbE aiming at an even higher capacity is almost complete.

As shown in FIG. 18, in an arrangement example of a 100 GBase-LR4/ER4 optical transmission system, an LD driver using a shunt circuit arrangement has been reported as an LD driver capable of performing high-speed operation at low power consumption in a transmission front end surrounded by a broken line.

In an arrangement example of a transmission front end using a shunt LD driver, as shown in FIG. 19, a portion surrounded by a broken line is a shunt LD driver portion. By adding the shunt LD driver portion parallel to an LD, a switch in the LD driver portion is turned on/off to carry information, as shown in FIGS. 20A, 20B, 20C, and 20D (FIG. 4 in Non-Patent Literature 1). Since the shunt LD driver has a high output resistance, the driver is integrated monolithically with the LD or mounted in the same package with the LD. Accordingly, impedance matching need not be performed, and high-speed operation can be performed at low power consumption.

RELATED ART LITERATURE

Non-Patent Literature

Non-Patent Literature 1: A. Moto, T. Ikagawa, S. Sato, Y. Yamasaki, Y. Onishi, and K. Tanaka, "A low power quad 25.78-Gbit/s 2.5 V laser diode driver using shunt-driving in 0.18 mm SiGe-BiCMOS", Compound Semiconductor Integrated Circuit Symposium, 2013

DISCLOSURE OF INVENTION

Problem to be Solved by the Invention

In an arrangement in which a driver portion is directly loaded to the anode of an LD by DC coupling, as shown in FIG. 21, when a CMOS process is used for the driver, the voltage applied to the anode of the LD and the voltage applied to the drain of a transistor are common.

However, since the breakdown voltage of the transistor tends to decrease along with micropatterning of the recent CMOS process, in the associated shunt LD driver shown in FIG. 21, a voltage applied between the drain and source of the transistor exceeds the breakdown voltage, thereby undesirably breaking the transistor. In addition, a resonant peak is present in an EO response at an LD relaxation oscillation frequency $f_r$, and the overshooting and distortion undesirably appear in the optical waveform due to this resonant peak.

The present invention has been made to solve these problems, and has as its object to provide a DML driving technology capable of avoiding the breakdown of the transistor.

Means of Solution to the Problem

In order to achieve the above object, a DML driving circuit according to the present invention is a DML driving circuit including a power supply circuit configured to supply a driving current to a laser diode and a driver circuit connected in parallel to the laser diode, configured to bypass the driving current in accordance with an input modulating signal, wherein the driver circuit comprises a plurality of cascode-connected NMOS transistors, the modulating signal is applied to a gate terminal of a lowermost stage transistor located at a lowermost stage out of the NMOS transistors, and an upper stage bias potential that is a sum of a minimum gate-source voltage and a maximum drain-source voltage of a transistor located immediately below an upper stage transistor located at an upper stage above the lowermost stage transistor of the NMOS transistors is applied to a gate terminal of the upper stage transistor.

Effect of the Invention

According to the present invention, since a drain-source voltage $V_{DS}$ obtained when the transistor of the driving circuit is turned off can be suppressed not to exceed a maximum voltage $V_{DSmax}$, the breakdown of the transistor which occurs when $V_{DS}$ exceeds the breakdown voltage can be avoided.

BRIEF DESCRIPTION OF DRAWINGS

FIG. 11 is a graph showing a compensation operation of the EO response;

BEST MODE FOR CARRYING OUT THE INVENTION

Embodiments of the present invention will now be described with reference to the accompanying drawings.

First Embodiment

A DML driving circuit 10 according to the first embodiment of the present invention will be described with reference to FIG. 1.

The DML driving circuit 10 according to this embodiment is a shunt LD driving circuit used in a transmission front end of an optical transmission system to drive a DML (Directly Modulated Laser) in which the light intensity of an LD (Laser Diode) is directly modulated. According to this embodiment, a current source load type arrangement example will be described.

Figure 1:
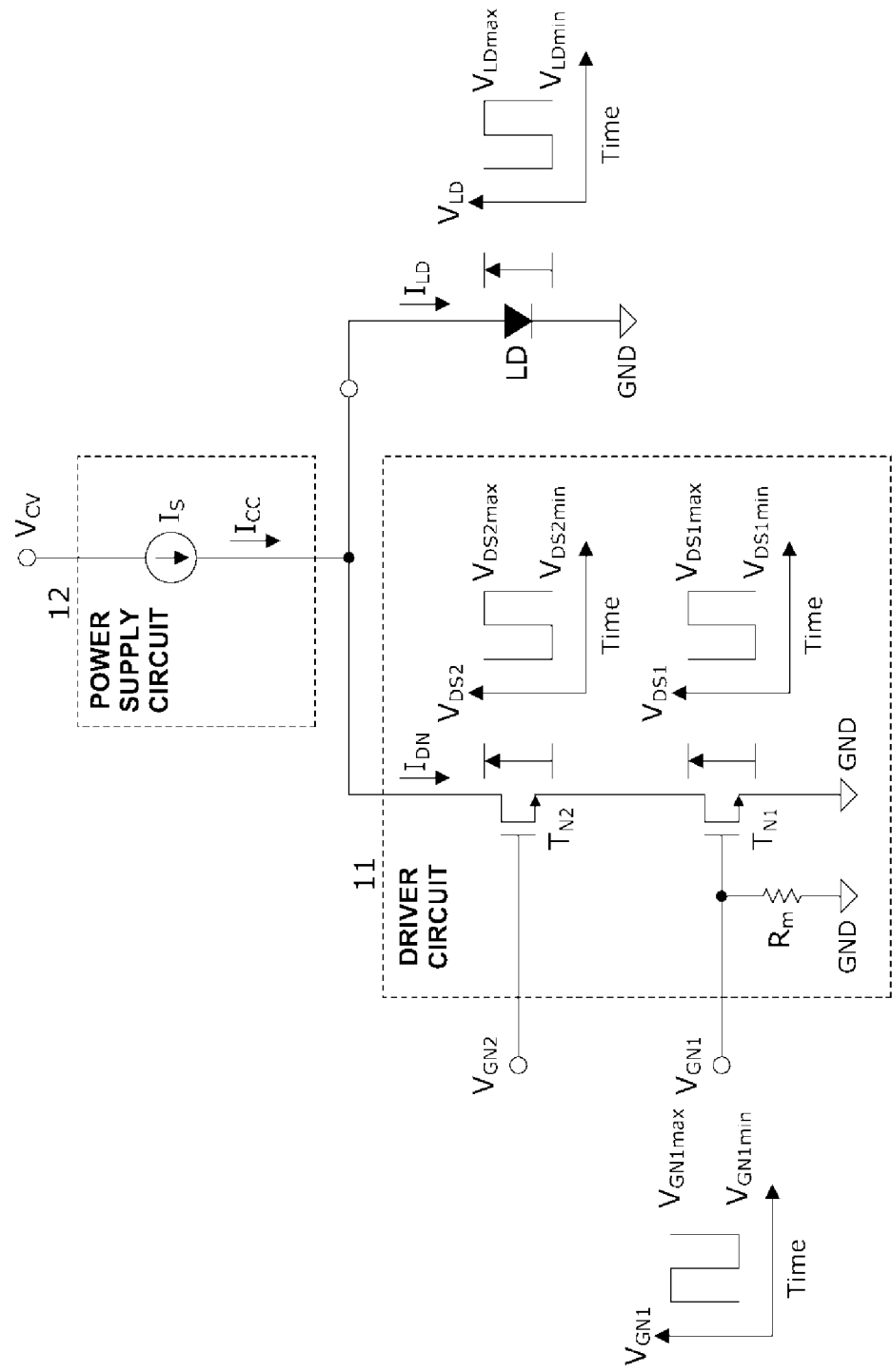
FIG. 1 is a circuit diagram showing the arrangement of a DML driving circuit according to the first embodiment.

As shown in FIG. 1, the DML driving circuit 10 according to this embodiment includes a power supply circuit 12 for supplying a driving current to an LD and a driver circuit 11 connected to the LD in parallel to bypass the driving current in accordance with an input modulating signal. According to the feature of this embodiment, the transistors of the driver circuit 11 are two cascode-connected transistors.

The driver circuit 11 is formed from an NMOS lowermost stage transistor $T_{N1}$ located at the lower stage of the cascode connection and having the gate terminal applied with a modulating single $V_{GN1}$ and the source terminal connected to a ground potential GND, and an NMOS upper stage transistor $T_{N2}$ located at the upper stage of the cascode connection and having the gate terminal applied with an upper stage bias potential $V_{GN2}$, the source terminal connected to the drain terminal of the transistor $T_{N1}$, and the drain terminal connected to the anode terminal of the LD.

On the other hand, the power supply circuit 12 is formed from a constant current source $I_S$ connected between a constant voltage source $V_{CV}$ and the LD. The anode terminal of the LD is connected to the constant current source $I_S$, and the cathode terminal of the LD is connected to GND.

That is, in a transmission front end 1, the drain terminal of $T_{N2}$ included in the driver circuit 11 is directly loaded to the anode terminal of the LD. Assuming that the maximum value and the minimum value of $V_{GN1}$ applied to $T_{N1}$ are defined as $V_{GN1max}$ and $V_{GN1min}$, when $V_{GN1}$ is set at $V_{GN1min}$, an anode-cathode voltage $V_{LD}$ of the LD becomes a maximum value $V_{LDmax}$.

In this case, assume that drain-source voltages $V_{DS1}$ and $V_{DS2}$ of $T_{N1}$ and $T_{N2}$ are given as $V_{DS1max}$ and $V_{DS2max}$ and are divided to satisfy $V_{DS1max}=V_{DS2max}=V_{LDmax}/2$, it is desirable that the sizes of $T_{N1}$ and $T_{N2}$ are equal to each other. In addition, the gate voltage $V_{GN2}$ of $T_{N2}$ must satisfy equation (1). When $V_{GN2}$ satisfies equation (1), the gate-source voltages obtained when $T_{N1}$ and $T_{N2}$ are turned off become equal to each other, thereby obtaining $V_{DS1max}=V_{DS2max}=V_{LDmax}/2$.

$$V_{GN2}=V_{GN1min}+V_{DS1max} \quad (1)$$

A resistive element $R_m$ connected between the gate terminal of $T_{N1}$ and GND is an input matching resistor. When a 50Ω input transmission line is used, $R_m$ is 50Ω. In addition, when a constant current supplied from $I_S$, a bypass (extraction) current flowing to the DML driving circuit 10, and the driving current flowing to the LD are defined as $I_{CC}$, $I_{DN}$, and $I_{LD}$, respectively, $I_{CC}=I_{DN}+I_{LD}$.

Figure 2:
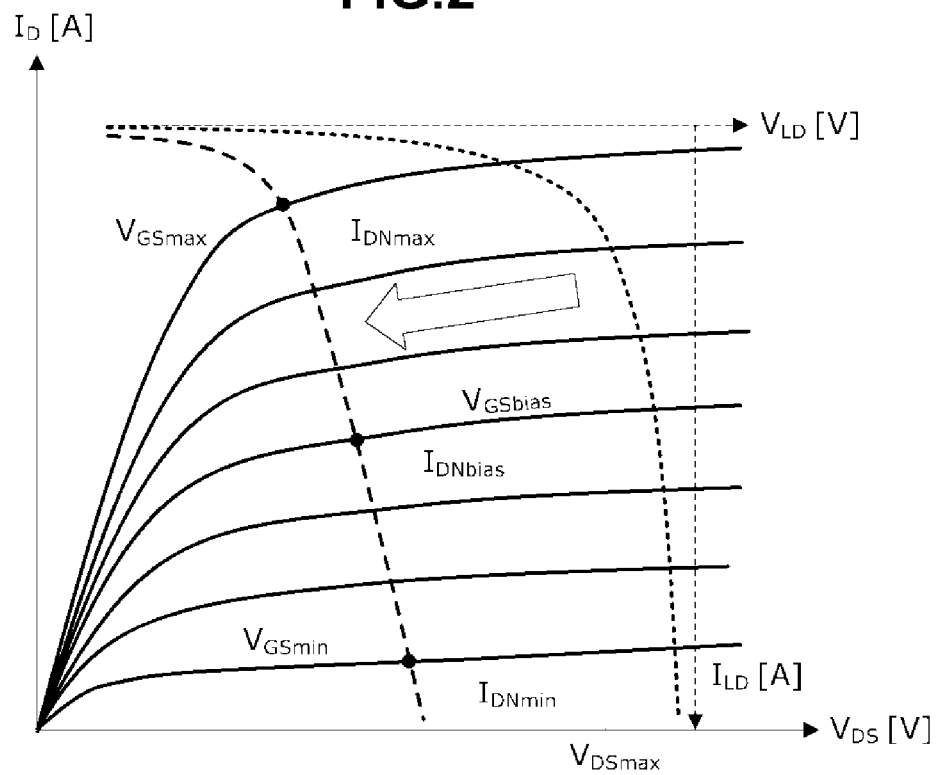
FIG. 2 is a graph showing the I-V characteristics of cascode-arranged transistors according to the first embodiment.

Referring to FIG. 2, $V_{GSmax}$, $V_{GSbias}$ and $V_{GSmin}$ are the maximum value, the bias value, and the minimum value, respectively, of the gate-source voltage $V_{Gs}$ of the transistor. $I_{DNmax}$, $I_{DNbias}$, and $I_{DNmin}$ are the maximum current, the bias current, and the minimum current of $I_{DN}$, respectively. $V_{DSmax}$ indicates the breakdown voltage value of the drain-source voltage of the transistor.

In the I-V characteristics of the cascode-arranged transistors according to the first embodiment, as shown in FIG. 2, when $I_{DN}$ is $I_{DNmax}$, $I_{LD}$ becomes the minimum current value $(=I_{LDmin})$. When $I_{DN}$ is $I_{DNmin}$, $I_{LD}$ becomes the maximum current value $(=I_{LDmax})$. A dotted line in FIG. 2 indicates the I-V characteristic of the transistor when the driver is formed from only the lower stage transistor without cascode connection. Although $V_{DS}$ exceeds $V_{DSmax}$ when the transistor is turned off in case that the arrangement is formed from only the lower stage transistor, the voltage applied to the lower stage transistor is divided by the cascode arrangement, thereby obtaining the I-V characteristic indicated by a broken line.

As described above, since $V_{DS}$ obtained when the transistor is turned off can be suppressed not to exceed $V_{DSmax}$, the breakdown of the transistor which occurs when the voltage applied between the drain and the source exceeds the breakdown voltage can be avoided.

Figure 3:
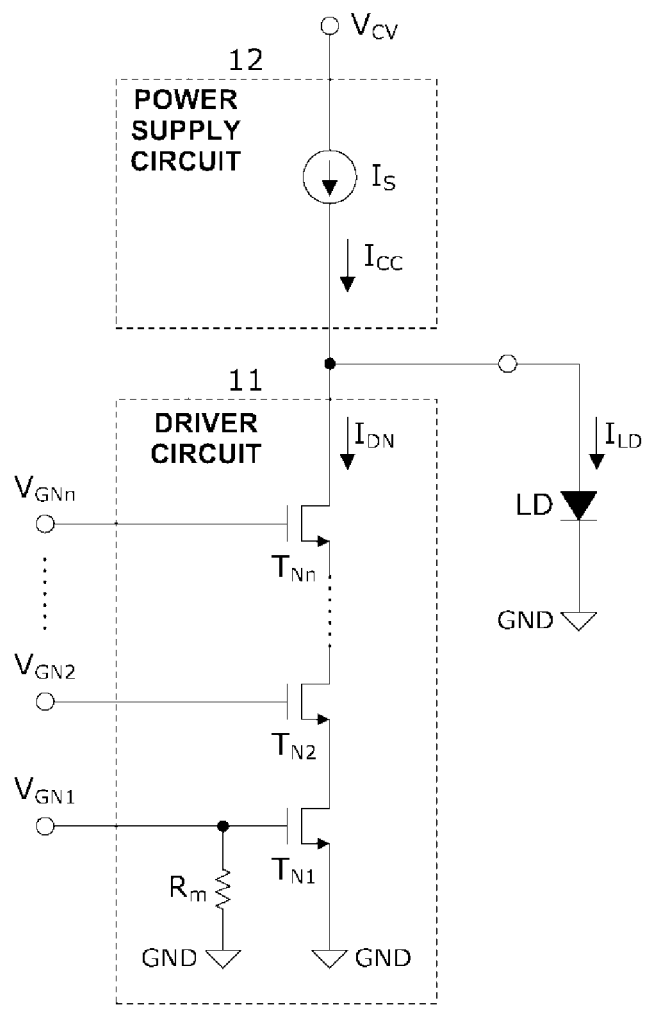
FIG. 3 is a circuit diagram showing an example of a derived circuit arrangement of the DML driving circuit shown in FIG. 1.

As an example of the arrangement of a derived circuit of the DML driving circuit shown in FIG. 1, a multi-stage connection example for the upper stage transistors is available, as shown in FIG. 3. The upper stage transistor $T_{N2}$ is formed from a cascode arrangement of a plurality of multi-stage connected transistors $T_{N2}$ to $T_{Nn}$. Accordingly, a voltage applied to $T_{N1}$ can be reduced as compared with the two-stage arrangement. For example, by employing the n-stage cascode arrangement, a voltage applied to each stage transistor can be reduced to 1/n of the anode-cathode voltage of the LD.

Second Embodiment

A DML driving circuit 10 according to the second embodiment of the present invention will now be described with reference to FIG. 4. In this embodiment, an example of a PMOS load type arrangement will be described.

As compared with FIG. 1, the DML driving circuit 10 according to the second embodiment is obtained such that a constant current source $I_S$ of a power supply circuit 12 is replaced with a PMOS current control transistor $T_{P1}$ connected between a constant voltage source $V_{SS}$ and an LD.

Figure 4:
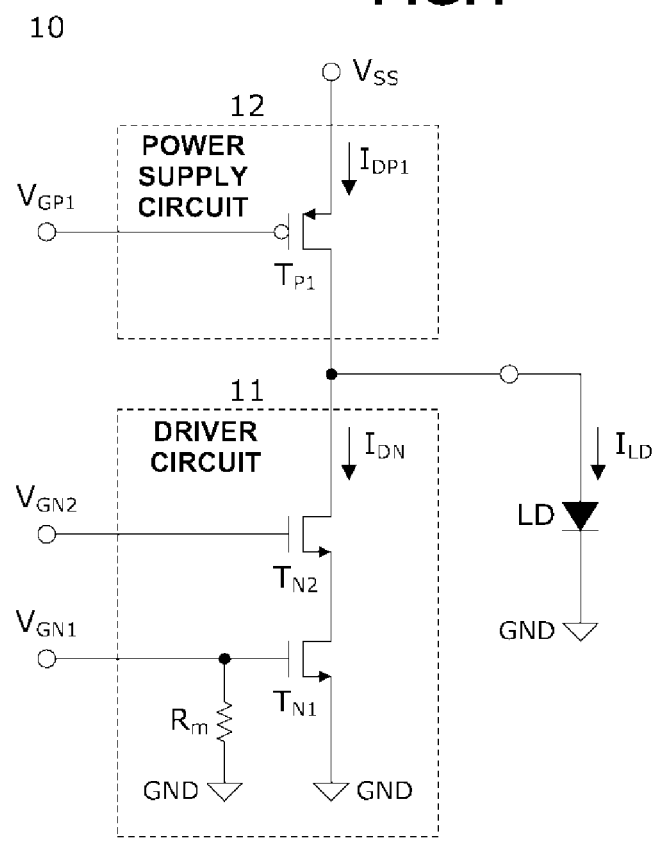
FIG. 4 is a circuit diagram showing the arrangement of a DML driving circuit according to the second embodiment.

As shown in FIG. 4, a current control bias potential $V_{GP1}$ is applied to the gate terminal of $T_{P1}$, the source terminal of $T_{P1}$ is connected to the constant voltage source $V_{SS}$, and the drain terminal of $T_{P1}$ is connected to the anode terminal of the LD. When a current flowing through $T_{P1}$ is given as $I_{DP1}$, $I_{DP1}=I_{DN}+I_{LD}$.

Figure 5:
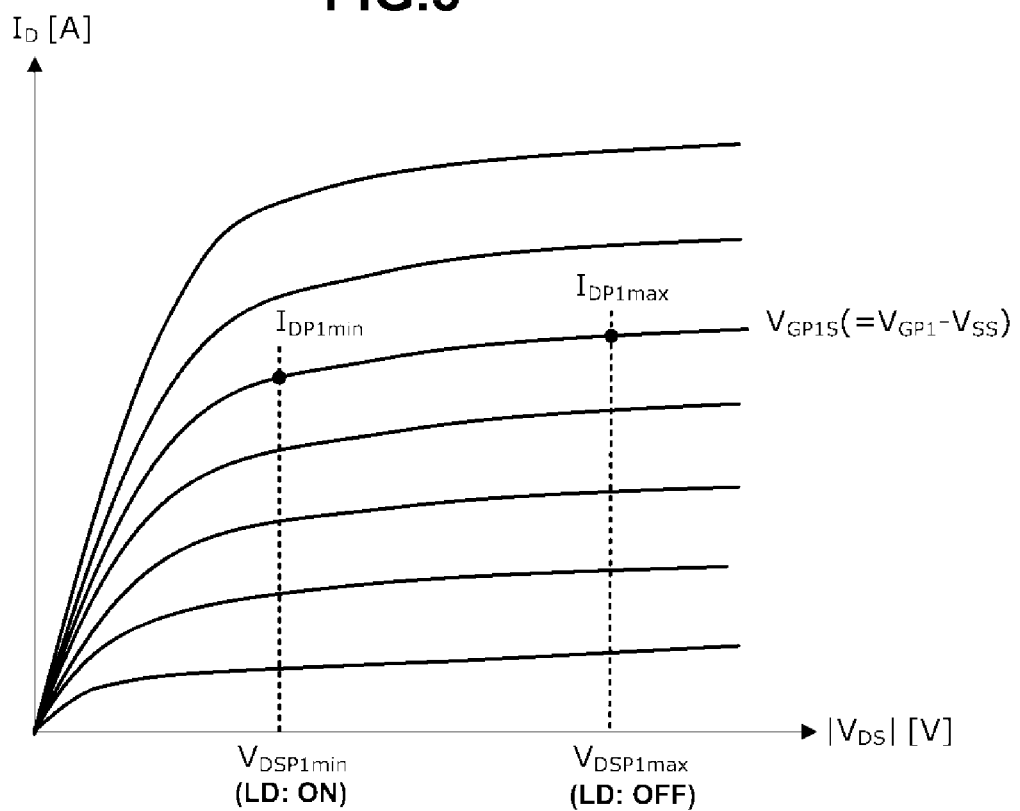
FIG. 5 is a graph showing the I-V characteristics of a current control transistor according to the second embodiment.

As shown in FIG. 5, in the I-V characteristics of the current control transistor according to the second embodiment, since $V_{GP1}$ and $V_{SS}$ are DC voltages, the gate-source voltage of $T_{P1}$ becomes $V_{GP1}-V_{SS}$, thereby obtaining a curve indicated by $V_{GP1S}$. $I_{DP1max}$ and $I_{DP1min}$ are the maximum current value and the minimum current value, respectively. $|V_{DS}|$ at $I_{DP1max}$ is $V_{DSP1max}$, and $|V_{DS}|$ at $I_{DP1min}$ is $V_{DPS1min}$. The LD is set off at $V_{DSP1max}$ and on at $V_{DSP1min}$. $I_{DP1}$, $I_{DN}$, and $I_{LD}$ in the ON/OFF states of the LD satisfy equations (2) and (3) below.

$$I_{DP1max}=I_{DNmax}+I_{LDmin} \quad (2)$$

$$I_{DP1min}=I_{DNmin}+I_{LDmax} \quad (3)$$

Figure 6:
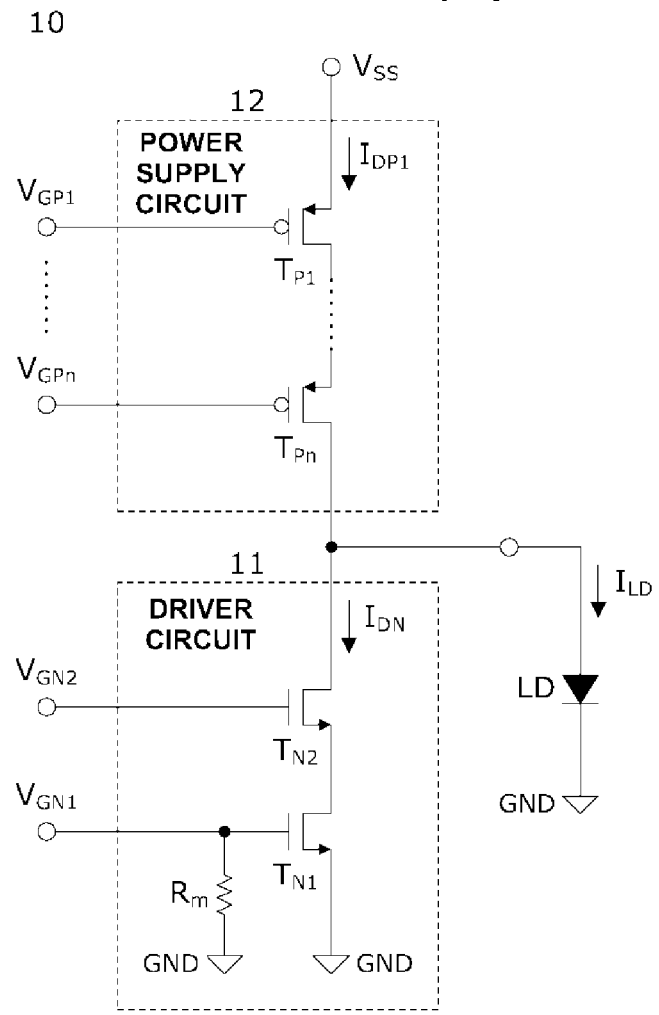
FIG. 6 is a circuit diagram showing an example of a derived circuit arrangement of the DML driving circuit shown in FIG. 4.

As an example of the derived circuit arrangement of the DML driving circuit shown in FIG. 4, a multi-stage connection example for the current control transistor $T_{P1}$ shown in FIG. 6 is available. A decrease in breakdown voltage due to a micropatterning process is progressing even in a PMOS transistor. To cope with this, as shown in FIG. 6, $T_{P1}$ is formed from a cascode arrangement of a plurality of multi-stage connected PMOS transistors $T_{P1}$ to $T_{Pn}$. Accordingly, a voltage applied to $T_{P1}$ is divided, and the breakdown of the transistor due to an operation in which the voltage exceeds the breakdown voltage can be avoided. In this case, the multi-stage connection example of the upper stage transistor shown in FIG. 3 may be applied, and the same effect as described above can be obtained.

Figure 7:
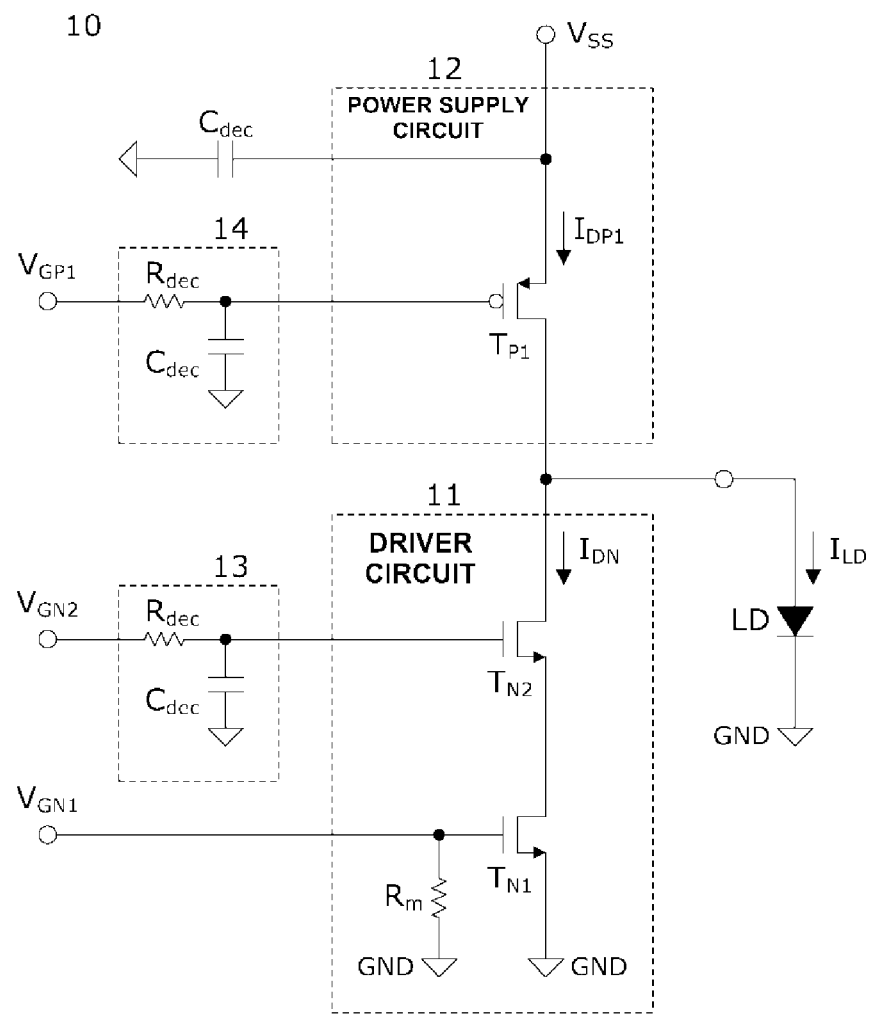
FIG. 7 is a circuit diagram sowing an example of another derived circuit arrangement of the DML driving circuit shown in FIG. 4.

As an example of the arrangement of another derived circuit of the DML driving circuit shown in FIG. 4, an example of the arrangement for suppressing voltage supply resonance shown in FIG. 7 is available. In this arrangement example, as compared with the arrangement in FIG. 4, an upper stage decoupling circuit (upper stage decoupler) 13 for removing a high-frequency noise component is connected between an upper stage bias voltage $V_{GN2}$ and the gate terminal of an upper stage transistor $T_{N2}$. In addition, a voltage supply decoupling circuit (power supply decoupler) 14 for removing a high-frequency noise component is connected between the current control bias potential $V_{GP1}$ and the gate terminal of the current control transistor $T_{P1}$.

Each of the upper stage decoupling circuit 13 and the power supply decoupling circuit 14 is formed from an RC low-pass filter including a resistive element $R_{dec}$ and a capacitive element $C_{dec}$. In addition, the decoupling capacitor $C_{dec}$ is connected between the drain terminal of $T_{N2}$ and GND. Note that no resistive element is added to the source terminal of $T_{P1}$ because the band degrades.

Each of the upper stage decoupling circuit 13 and the power supply decoupling circuit 14 has the frequency characteristic of the low-pass filter having a cutoff frequency $f_C$, as shown in equation (4). Accordingly, the high-frequency component superimposed on $V_{GN2}$ and $V_{GP1}$ is reduced by the upper stage decoupling circuit 13 and the power supply decoupling circuit 14, thereby suppressing the power supply resonance caused by the high-frequency component.

$$f_C = \frac{1}{2\pi C_{dec} R_{dec}} \quad (4)$$

Third Embodiment

A DML driving circuit 10 according to the third embodiment of the present invention will now be described with reference to FIG. 8. In this embodiment, an example of a high-frequency choke coil load arrangement will be described.

As compared with FIG. 1, the DML driving circuit 10 according to this embodiment is obtained by replacing a constant current source $I_S$ of a power supply circuit 12 with a constant voltage source $V_{SS}$ and a high-frequency choke coil $L_C$.

Figure 8:
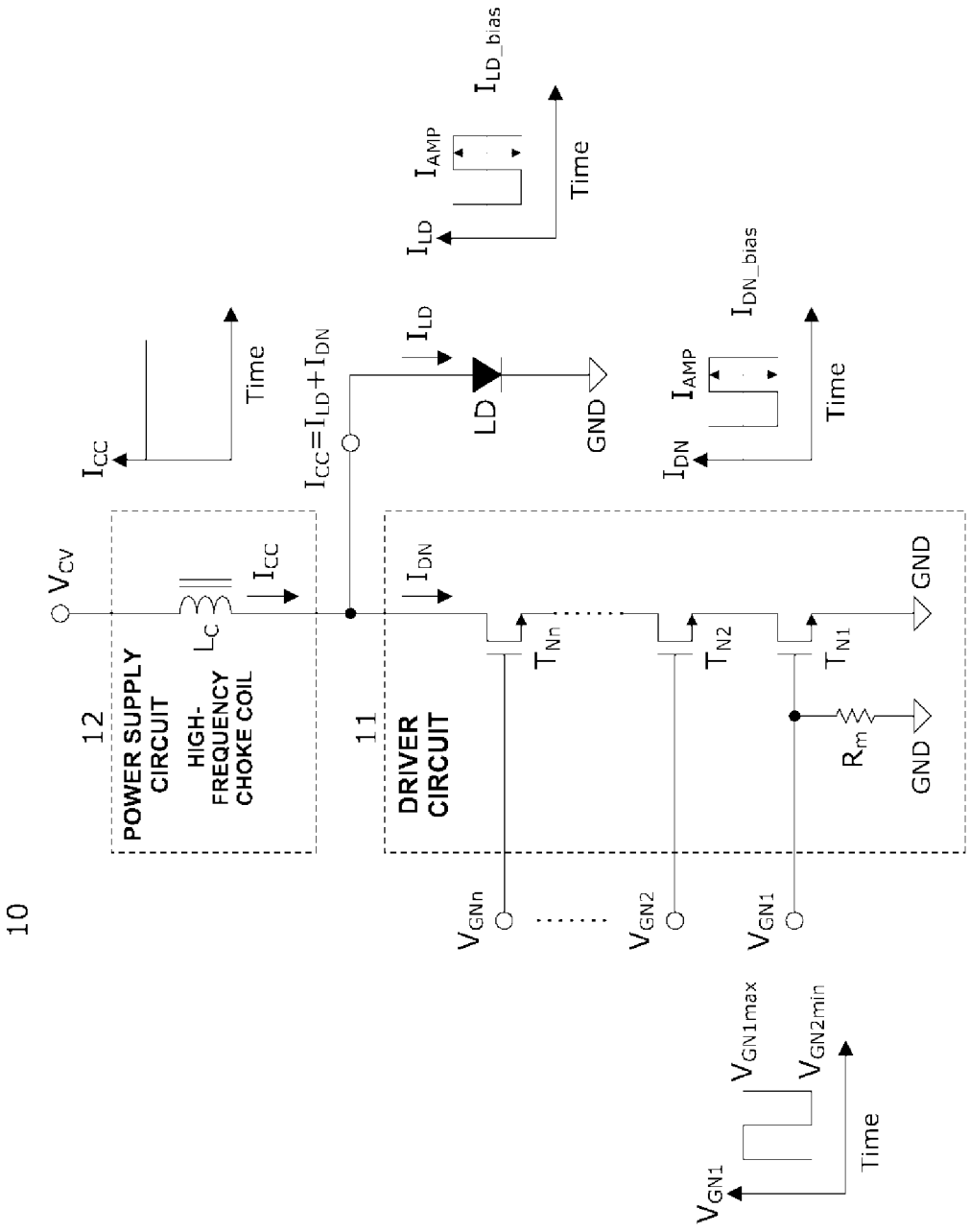
FIG. 8 is a circuit diagram showing the arrangement of a DML driving circuit according to the third embodiment.

As shown in FIG. 8, one end of $L_C$ is connected to $V_{SS}$, and the other end is connected to the anode terminal of the LD.

$L_C$ is regarded to be short-circuited upon application of a DC bias and to be open upon application of a high-frequency signal. The DC bias from $V_{SS}$ is applied to a driver circuit 11 and the LD. A bypass (extraction) current $I_{DN}$ is modulated by a modulating current $I_{AMP}$ in correspondence with a voltage amplitude applied to $V_{GN1}$ The modulating current of $I_{LD}$ is equal to $I_{AMP}$. When the voltage of the modulating signal $V_{GN1}$ is changed from the application of the DC bias in a direction in which an NMOS transistor $T_{N1}$ is turned on, $I_{LD}$ decreases from $I_{LD\ bias}$. To the contrary, when the voltage of the modulating signal $V_{GN1}$ is changed from the application of the DC bias in a direction in which an NMOS transistor $T_{N1}$ is turned off, $I_{LD}$ increases from $I_{LD\ bias}$.

Figure 9:
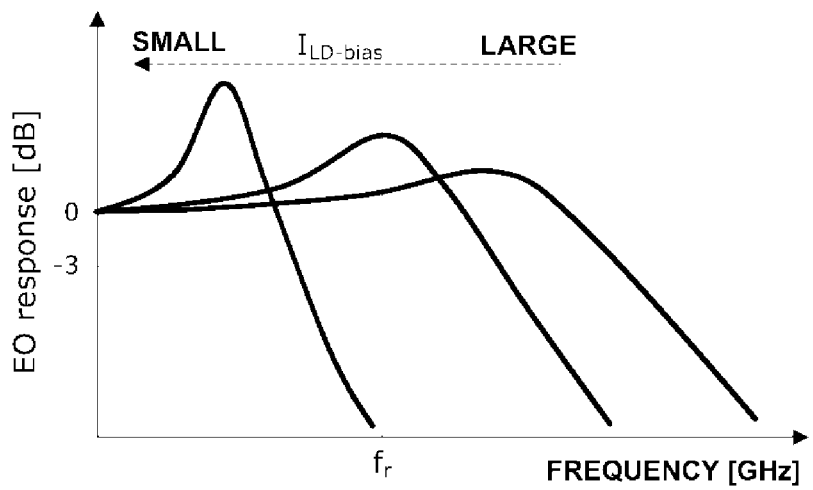
FIG. 9 is a graph showing EO responses of an LD in FIG. 8.

As shown in FIG. 9, the EO response of the LD of FIG. 8 has a resonant peak in the EO response at a relaxation oscillation frequency $f_r$. The resonant peak increases when the bias current $I_{LD\ bias}$ to the LD decreases. The overshooting and distortion occur in the optical waveform due to this resonant peak.

Figure 10A:
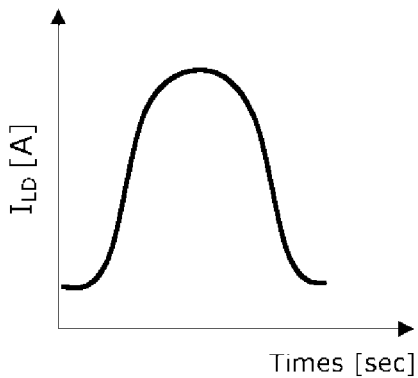
FIG. 10A is a graph showing an influence ($I_{LD}$ waveform) of a resonant peak on the optical waveform.
Figure 10B:
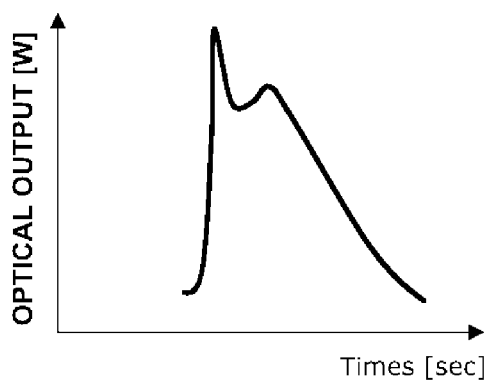
FIG. 10B is a graph showing an influence (optical waveform) of the resonant peak on the optical waveform.

When $I_{LD}$ has a pulsed current waveform, as shown in the $I_{LD}$ waveform of FIG. 10A and the optical waveform of FIG. 10B, the influence of the resonant peak on the optical waveform causes an early rise time of the optical waveform, thus obtaining an optical waveform with overshooting and distortion. In addition, the fall time is delayed. In this manner, a pulse current having a large signal amplitude is injected to the LD under the conditions in which the resonant peak is high and the bias current is small, the optical waveform becomes a waveform with overshooting and distortion while the rise time is steep and the fall time is delayed.

According to this embodiment, as shown in FIG. 11, the LD is driven by the driver circuit 11 based on an $I_{LD}$ characteristic which cancels the resonant peak of the EO response of the LD alone, thereby reducing the influence of the resonant peak on the optical waveform at the relaxation oscillation frequency. A dotted line in FIG. 11 indicates the EO response of the LD alone, and a solid line indicates the frequency characteristic of $I_{LD}$ when the LD is driven by a driver of this embodiment for compensating the EO response of the LD alone. A thick line is the compensated EO response.

High-frequency band compensation is performed for the frequency characteristic of $I_{LD}$ by the driver circuit 11 of this embodiment in order to prevent the band of the compensated EO response from degrading more than the EO response of the LD alone.

Fourth Embodiment

A DML driving circuit 10 according to the fourth embodiment of the present invention will now be described with reference to FIG. 12. In this embodiment, an example of an arrangement for compensating the optical waveform distortion caused by the resonant peak in the DML driving circuit 10 will be described.

Figure 12:
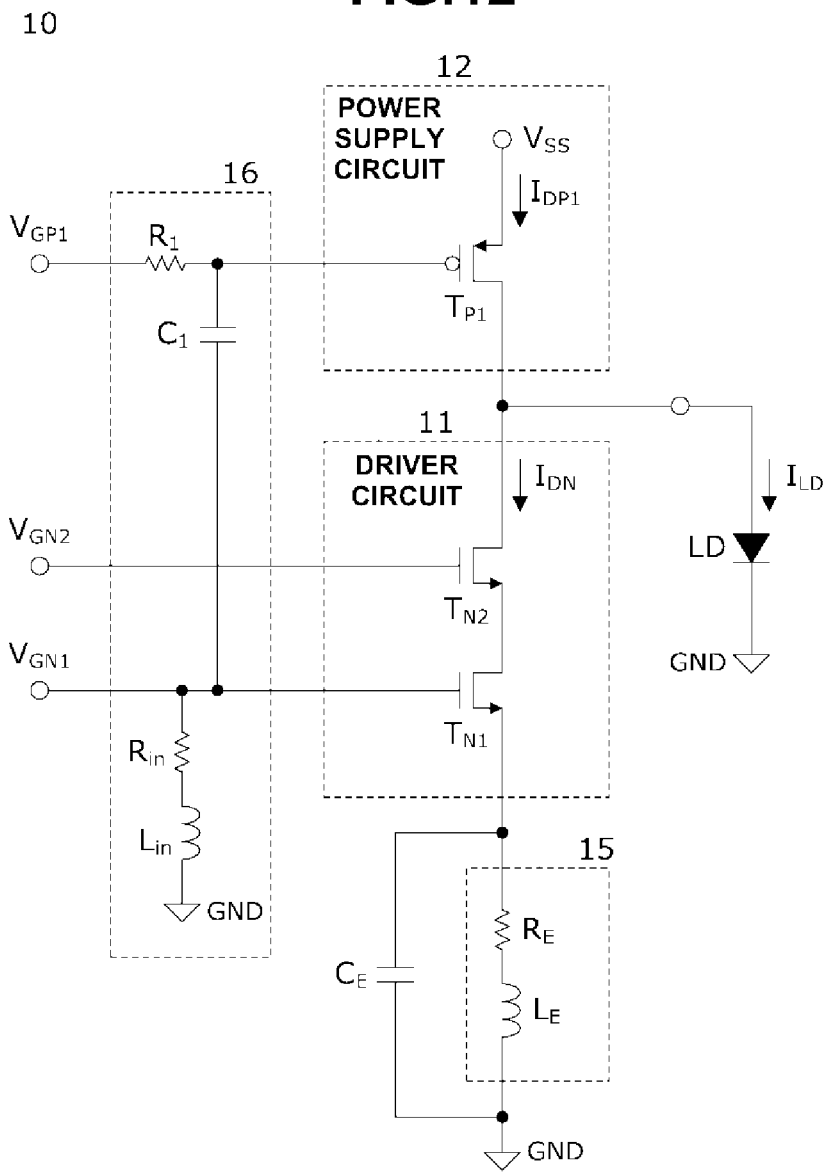
FIG. 12 is a circuit diagram showing the arrangement of a DML driving circuit according to the fourth embodiment.

As compared with FIG. 4, the DML driving circuit 10 of FIG. 12 is arranged such that a series circuit 15 of a resistive element $R_E$ and an inductor $L_E$ is added between the source terminal of a lowermost stage NMOS transistor $T_{N1}$ and a ground potential GND, and a capacitor $C_E$ is added in parallel to this series circuit 15. In addition, a high-pass filter 16 is added to the gate terminal of $T_{N1}$ and the gate terminal of a current control transistor $T_{P1}$.

The high-pass filter 16 includes an input resistive element $R_1$ having one end applied with a current control bias potential $V_{GP1}$ and the other end connected to the gate terminal of $T_{P1}$, a capacitive element $C_1$ connected between the gate terminal of $T_{P1}$ and the gate terminal of $T_{N1}$, and a series circuit including a resistive element $R_{in}$ and an inductor $L_{in}$ and connected between the gate terminal of $T_{N1}$ and GND.

Since the series circuit 15 is formed from a series connection of $R_E$ and $L_E$, its impedance $Z_{RL}$ is represented by equation (5).

$$Z_{RL} = R_E + j2\pi f L_E \quad (5)$$

Figure 13:
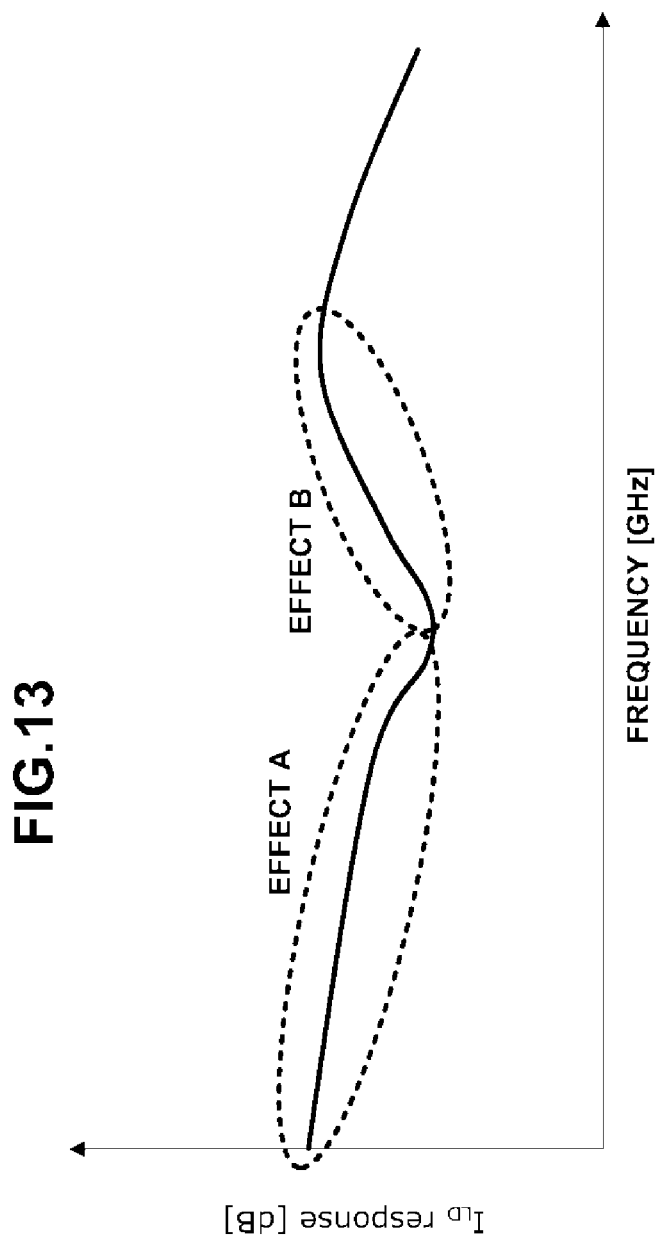
FIG. 13 is a graph showing the frequency characteristic of a driving current according to the fourth embodiment.

As shown in FIG. 13, since the impedance of the series circuit 15 increases with an increase in frequency, the gain of $I_{LD}$ decreases, as shown in an effect A. By adding $C_E$ to the series circuit 15 in parallel, the impedance of the series circuit 15 can be reduced in a high-frequency region, as shown in an effect B, thereby increasing the gain. An impedance $Z_{RLC}$ obtained by adding the series circuit 15 and $C_E$ is expressed by equation (6).

$$Z_{RLC} = \frac{\frac{L_E}{C_E} + \frac{R_E}{j2\pi f C_E}}{\frac{1}{j2\pi f C_E} + R_E + j2\pi f L_E} \quad (6)$$

As described, when both the series circuit 15 and $C_E$ are applied, the effect of the series circuit 15 is dominant up to an arbitrary frequency, thereby reducing the gain of $I_{LD}$ response. However, when the frequency exceeds the arbitrary frequency, the effect of $C_E$ becomes dominant, thereby increasing the gain.

As for the high-pass filter 16, when $V_{GP1}$ side is observed from the $V_{GN1}$ side, the arrangement can be regarded as a high-pass filter due to the arrangement including $C_1$ and $R_1$. The transfer characteristic of this high-pass filter 16 can be expressed by equations (7) and (8).

$$\frac{V_{GGP1}}{V_{GN1}} = \frac{1}{1 + \frac{1}{j2\pi f C_1 R_1}} \quad (7)$$

$$f_C = \frac{1}{2\pi C_1 R_1} \quad (8)$$

As shown in equations (7) and (8), a frequency $f_C$ becomes a cutoff frequency for the gain of $I_{LD}$. As shown in the effect B of FIG. 13, the gain increases in the high-frequency region by the high-pass filter 16. By adding $C_1$ and $R_1$, the value of the input impedance in the high-frequency region changes by only the terminating resistor in the input impedance of $V_{GN1}$.

For this reason, according to this embodiment, by adding the inductance $L_{in}$ to the input terminating resistor $R_{in}$ in series, adjustment is performed such that the input impedance is matched in a desired frequency range. Equation (9) indicates an input impedance $Z_{in}$ viewed from $V_{GN1}$. For example, when a 50Ω input line is used, $L_{in}$ needs to be set such that $Z_{in}$ is set to 50Ω in the desired frequency range.

$$Z_{in} = \frac{(R_{in} + j2\pi f L_{in}) \cdot \left( \frac{1}{j2\pi f C_1} + R_1 \right)}{(R_{in} + j2\pi f L_{in}) + \frac{1}{j2\pi f C_1} + R_1} \quad (9)$$

Figure 14:
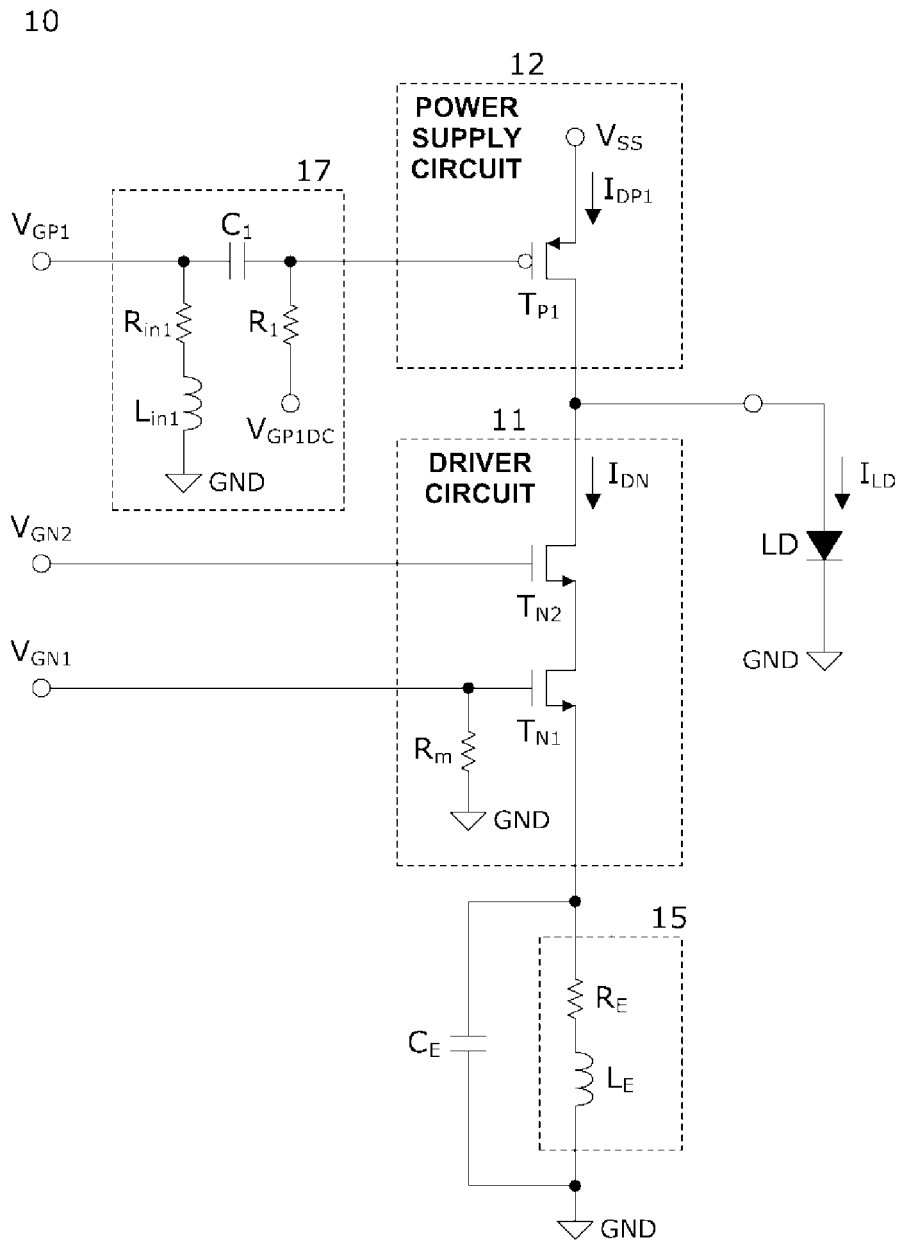
FIG. 14 is a circuit diagram showing an example of a derived circuit arrangement of the DML driving circuit shown in FIG. 12.

As an example of the arrangement of a derived circuit of the DML driving circuit shown in FIG. 12, an optical waveform compensation example using a high-pass filter 17 in place of the high-pass filter 16, as shown in FIG. 14, is available.

The high-pass filter 17 includes an input capacitive element $C_1$ having one end applied with an in-phase signal $V_{GP1}$ of the modulating signal $V_{GN1}$ and the other end connected to the gate terminal of the current control transistor $T_{P1}$, a series circuit of a resistive element $R_{in1}$ and an inductor $L_{in1}$ connected between one end of the capacitive element $C_1$ and a ground potential GND, and a resistive element $R_1$ connected between a current control bias potential $V_{GP1DC}$ and the other end of the input capacitive element $C_1$.

As compared with FIG. 12, $V_{GP1}$ is an RF input signal in phase with $V_{GN1}$, and given from $V_{GP1DC}$, whereas the DC voltage applied to $T_{P1}$ is $V_{GP1}$. As in FIG. 12, the transfer characteristic and the cutoff frequency of the high-pass filter 17 are expressed by equations (10) and (11).

$$\frac{V_{GGP1}}{V_{GP1}} = \frac{1}{1 + \frac{1}{j2\pi f C_1 R_1}} \quad (10)$$

$$f_C = \frac{1}{2\pi C_1 R_1} \quad (11)$$

As in FIG. 12, by adding $C_1$ and $R_1$, the input impedance value changes in the high-frequency region by only the terminating resistor $R_{in1}$ in the input impedance of $V_{GP1}$.

For this reason, in FIG. 14, by adding the inductance $L_{in1}$ to the input terminating resistor $R_{in1}$ in series, adjustment is performed such that the input impedance is matched in a desired frequency range. Equation (9) indicates an input impedance $Z_{in}$ viewed from $V_{GP1}$. For example, when a 50Ω input line is used, $L_{in1}$ needs to be set such that $Z_{in}$ is set to 50Ω in the desired frequency range.

$$Z_{in} = \frac{(R_{in1} + j2\pi f L_{in1}) \cdot \left(\frac{1}{j2\pi f C_1} + R_1\right)}{(R_{in1} + j2\pi f L_{in1}) + \frac{1}{j2\pi f C_1} + R_1} \quad (12)$$

Figure 15:
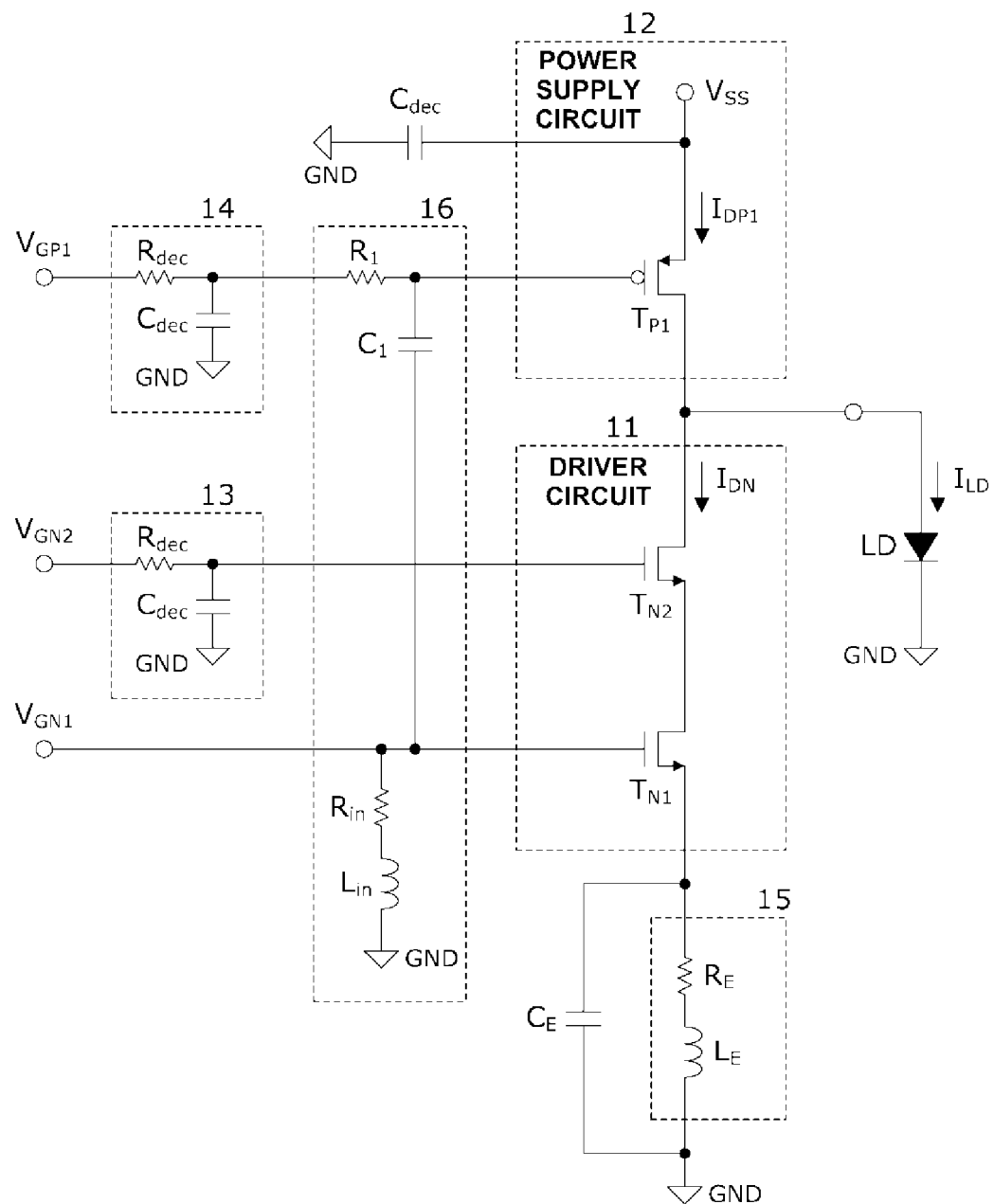
FIG. 15 is a circuit diagram showing an example of another derived circuit arrangement of the DML driving circuit shown in FIG. 12.

As an example of the arrangement of another derived circuit of the DML driving circuit shown in FIG. 12, an arrangement example as shown in FIG. 15 is available. As compared with FIG. 12, an upper stage decoupling circuit 13, a power supply decoupling circuit 14, and a decoupling capacitor $C_{dec}$, shown in FIG. 7, are added to the arrangement of FIG. 12.

In other words, the upper stage decoupling circuit 13 and the power supply decoupling circuit 14 for suppressing the power supply resonance are connected between $V_{GN2}$ and the gate terminal of $T_{N2}$ and between $V_{GP1}$ and the gate terminal of $T_{P1}$, respectively, to which the DC voltages are applied. The decoupling capacitor $C_{dec}$ for performing similar suppression is connected to the source terminal of $T_{P1}$.

The capacitor $C_{dec}$ of the decoupling functional portion newly added has a very large value for the input impedance $Z_{in}$, the input impedance $Z_{in}$ is expressed by equation (9).

Figure 16:
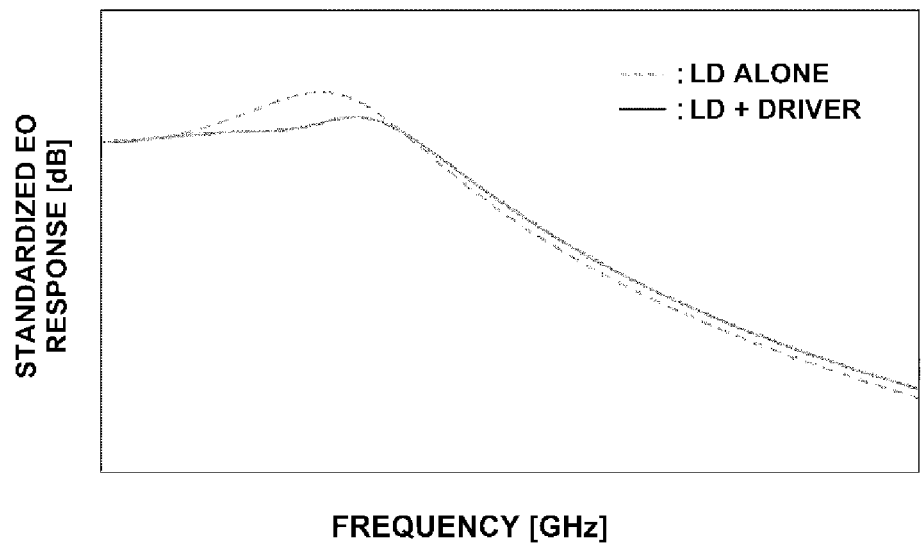
FIG. 16 is a graph showing EO responses of an LD shown in FIG. 15.

When the DML driving circuit 10 in FIG. 15 is driven to equalize the bias current values to the LD, the EO response of the LD by FIG. 15 is given as a graph shown in FIG. 16. In this manner, according to the DML driving circuit 10 shown in FIG. 15, it is found that the resonant peak is reduced at the relaxation oscillation frequency.

Figure 17A:
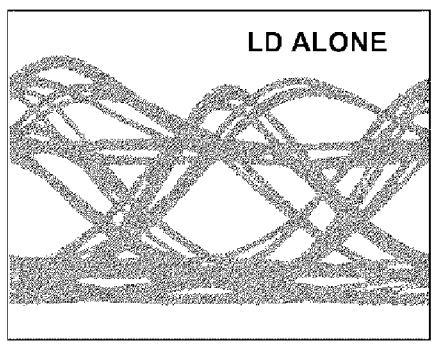
FIG. 17A is a graph showing an example of a large signal optical waveform (driving of an LD alone) at a relaxation oscillation frequency.
Figure 17B:
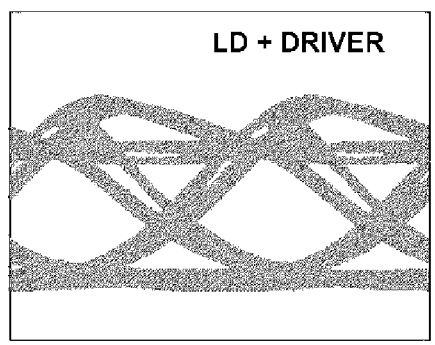
FIG. 17B is a graph showing an example of a large signal optical waveform (LD driving by a DML driving circuit 10 in FIG. 15)
Figure 18:
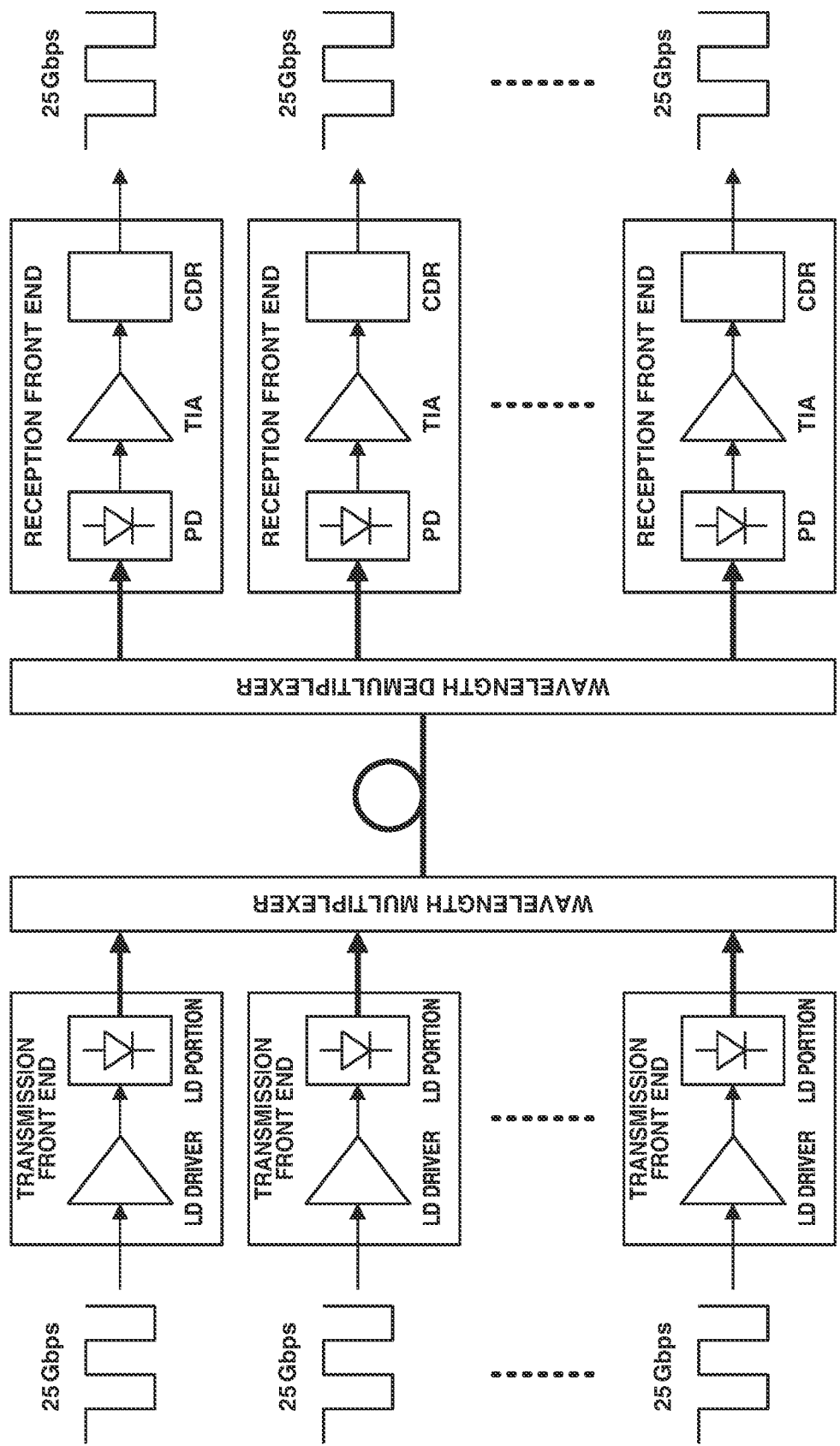
FIG. 18 is a block diagram of an example of the arrangement of a 100 GBase-LR4/ER4 optical transmission system.
Figure 19:
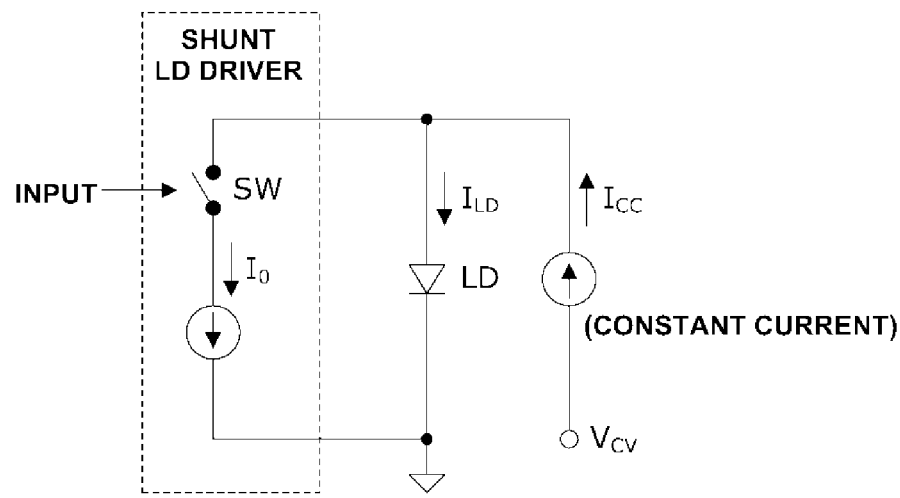
FIG. 19 is a circuit diagram showing an example of the arrangement of a transmission front end using a shunt LD driver.
Figure 20A:
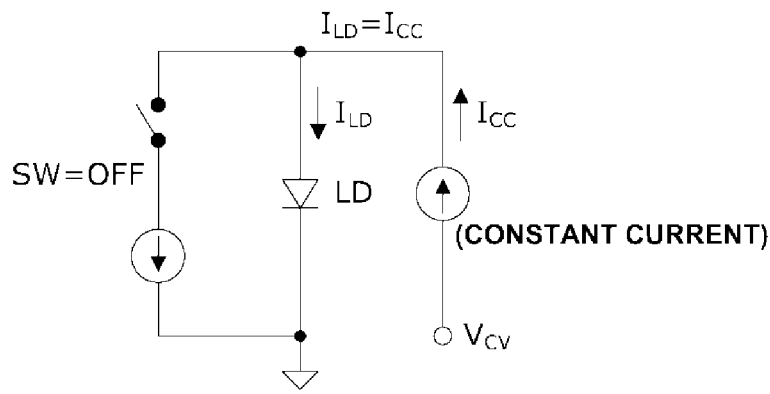
FIG. 20A is a circuit diagram showing an example (SW=OFF) of the circuit of the transmission front end shown in FIG. 19.
Figure 20B:
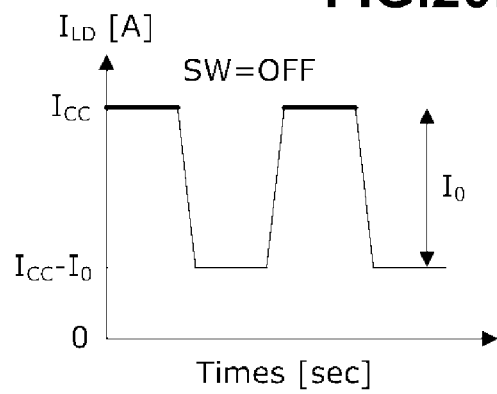
FIG. 20B is a timing chart showing an example (SW=OFF) of the operation of the transmission front end shown in FIG. 19.
Figure 20C:
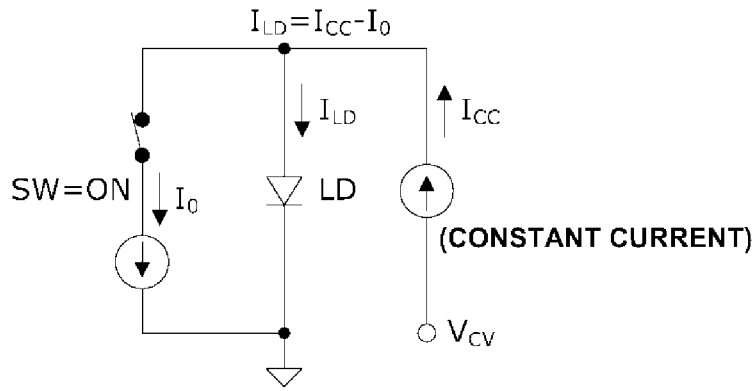
FIG. 20C is a circuit diagram showing an example (SW=ON) of the circuit of the transmission front end shown in FIG. 19.
Figure 20D:
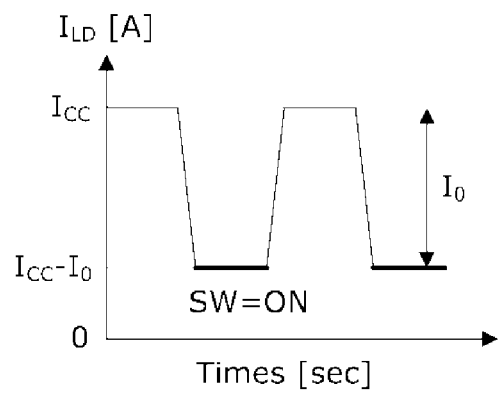
FIG. 20D is a timing chart showing an example (SW=ON) of the operation of the transmission front end shown in FIG. 19.
Figure 21:
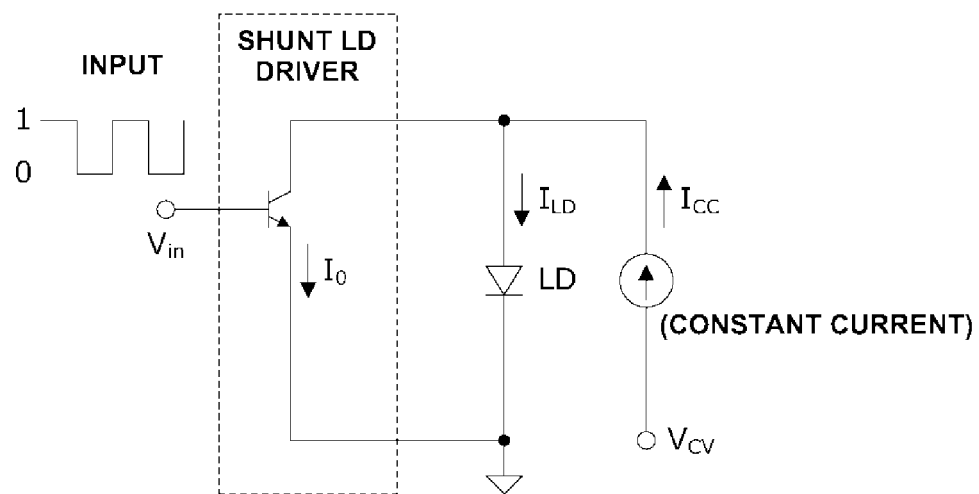
FIG. 21 is a circuit diagram showing an example of the arrangement of a transmission front end using an associated shunt LD driver.

As for the example of the large signal optical waveform at the relaxation oscillation frequency, FIG. 17A shows an optical waveform simulation result when driving is performed by the LD alone, and FIG. 17B shows the optical waveform simulation degradation when LD driving is performed by the DML driving circuit 10 of FIG. 15. As shown in FIGS. 17A and 17B, it is understood that when the LD is driven by the DML driving circuit 10 shown in FIG. 15, overshooting of the optical waveform is reduced, and an eye opening becomes clear.

Extension of Embodiments

The present invention has been described with reference to the embodiments, but the present invention is not limited to the above embodiments. The arrangements and details of the present invention can be variously changed by those skilled in the art within the scope of the present invention. In addition, the respective embodiments may be arbitrarily combined within the consistent range.

EXPLANATION OF THE REFERENCE NUMERALS AND SIGNS

10 . . . DML driving circuit, 11 . . . driver circuit, 12 . . . power supply circuit, 13 . . . upper stage decoupling circuit, 14 . . . power supply decoupling circuit, 15 . . . series circuit, 16, 17 . . . high-pass filter, LD . . . laser diode, $T_{N1}$ . . . lowermost stage transistor, $T_{N2}$-$T_{Nn}$ . . . upper stage transistor, $I_S$ . . . constant current source, $T_{P1}$-$T_{Pn}$ . . . current control transistor, $L_C$ . . . high-frequency choke coil

The invention claimed is:

1. A directly modulated laser driving circuit comprising:
a power supply circuit configured to supply a driving current to a laser diode; and
a driver circuit connected in parallel to the laser diode, configured to bypass the driving current in accordance with an input modulating signal,
wherein the driver circuit comprises a plurality of cascode-connected NMOS transistors,
the modulating signal is applied to a gate terminal of a lowermost stage transistor located at a lowermost stage out of the NMOS transistors, and
an upper stage bias potential that is a sum of a minimum gate-source voltage and a maximum drain-source voltage of a transistor located immediately below an upper stage transistor located at an upper stage above the lowermost stage transistor of the NMOS transistors is applied to a gate terminal of the upper stage transistor.

2. The directly modulated laser driving circuit according to claim 1, wherein the power supply circuit comprises a constant current source connected between a constant voltage source and the laser diode.

3. The directly modulated laser driving circuit according to claim 1, wherein the power supply circuit includes a high-frequency choke coil connected between a constant voltage source and the laser diode.

4. The directly modulated laser driving circuit according to claim 1, wherein the power supply circuit includes a PMOS current control transistor connected between a constant voltage source and the laser diode, and is configured to control the driving current to be constant based on a current control bias potential.

5. The directly modulated laser driving circuit according to claim 4, further comprising:
an upper stage decoupling circuit including an RC low-pass filter connected between the upper stage bias potential and the gate terminal of the upper stage transistor, and is configured to remove a high-frequency noise component;
a power supply decoupling circuit including an RC low-pass filter connected between the current control bias potential and the gate terminal of the PMOS current control transistor, and is configured to remove the high-frequency noise component; and
a decoupling capacitor connected between the drain terminal of the upper stage transistor and a ground potential.

6. The directly modulated laser driving circuit according to claim 4, further comprising:
a series circuit including a resistive element and an inductor connected between a source terminal of the lowermost stage transistor and a ground potential;
a capacitor connected between the source terminal of the lowermost stage transistor and the ground potential; and
a high-pass filter including an input resistive element having one end applied with the current control bias potential and the other end connected to a gate terminal of the current control transistor, a capacitive element connected between the gate terminal of the current control transistor and a gate terminal of the lowermost stage transistor, and a series circuit including a resistive element and an inductor connected between the gate terminal of the lowermost stage transistor and the ground potential.

7. The directly modulated laser driving circuit according to claim 6, further comprising:

an upper stage decoupling circuit including an RC low-pass filter connected between the upper stage bias potential and the gate terminal of the upper stage transistor, and is configured to remove a high-frequency noise component; and a power supply decoupling circuit including an RC low-pass filter connected between the current control bias potential and the one end of the input resistive element, and is configured to remove the high-frequency noise component.

8. The directly modulated laser driving circuit according to claim 4, further comprising:

a series circuit including a resistive element and an inductor connected between a source terminal of the lowermost stage transistor and a ground potential;

a capacitor connected between the source terminal of the lowermost stage transistor and the ground potential; and a high-pass filter including an input capacitive element having one end applied with an in-phase signal of the modulating signal and the other end connected to a gate terminal of the current control transistor, a series circuit including a resistive element and an inductor connected between the one end of the capacitive element and the ground potential, and a resistive element connected between the current control bias potential and the other end of the capacitive element.

* * * * *